United States Patent
Chaki et al.

(10) Patent No.: US 11,177,834 B2
(45) Date of Patent: Nov. 16, 2021

(54) COMMUNICATION METHOD AND APPARATUS USING POLAR CODES

(71) Applicant: NEC Corporation, Tokyo (JP)

(72) Inventors: Prakash Chaki, Tokyo (JP); Norifumi Kamiya, Tokyo (JP)

(73) Assignee: NEC CORPORATION, Tokyo (JP)

(*) Notice: Subject to any disclaimer, the term of this patent is extended or adjusted under 35 U.S.C. 154(b) by 75 days.

(21) Appl. No.: 16/497,017

(22) PCT Filed: Mar. 30, 2017

(86) PCT No.: PCT/JP2017/013306
§ 371 (c)(1),
(2) Date: Sep. 24, 2019

(87) PCT Pub. No.: WO2018/179246
PCT Pub. Date: Oct. 4, 2018

(65) Prior Publication Data
US 2020/0052719 A1 Feb. 13, 2020

(51) Int. Cl.
*H03M 13/00* (2006.01)
*H03M 13/15* (2006.01)
*H03M 13/25* (2006.01)

(52) U.S. Cl.
CPC ..... *H03M 13/1575* (2013.01); *H03M 13/616* (2013.01); *H03M 13/251* (2013.01)

(58) Field of Classification Search
CPC ........... H03M 13/1575; H03M 13/616; H03M 13/615; H03M 13/61; H03M 13/47; H03M 13/251; H03M 13/2948; H03M 13/15; H03M 13/13
See application file for complete search history.

(56) References Cited

U.S. PATENT DOCUMENTS

| | | |
|---|---|---|
| 2014/0173376 A1 | 6/2014 | Jeong et al. |
| 2014/0365842 A1 | 12/2014 | Li et al. |
| 2020/0021393 A1* | 1/2020 | Noh et al. ............. H04L 1/0057 |

(Continued)

FOREIGN PATENT DOCUMENTS

EP 2 899 911 A1 7/2015

OTHER PUBLICATIONS

Japanese Office Action for JP Application No. 2019-552289 dated Nov. 25, 2020 with English Translation.

(Continued)

*Primary Examiner* — Christine T. Tu
(74) *Attorney, Agent, or Firm* — Sughrue Mion, PLLC

(57) ABSTRACT

A communication device includes: an encoder that encodes an input vector to output a codeword using a generator matrix of polar code; a memory that stores a frozen set including frozen bit indices and a non-frozen set including non-frozen bit indices; and a controller that is configured to: a) select at least one check bit index from the frozen set in descending order of row weights of the generator matrix and in descending order of index reliabilities of the input vector; b) select at least one non-frozen bit index from the non-frozen set to compute at least one check bit from at least one bit of information bits at the at least one non-frozen bit index; and c) put the at least one check bit at the at least one check bit index.

13 Claims, 13 Drawing Sheets

(56) References Cited

U.S. PATENT DOCUMENTS

2020/0052718 A1* 2/2020 Prinz et al. ........... H03M 13/13
2021/0021844 A1* 1/2021 Hui et al. ............. H04N 19/189

OTHER PUBLICATIONS

Trifonov, "Design of polar codes for Rayleigh fading channel" 2015 International Symposium on Wireless Communication Systems (ISWCS), IEEE, Aug. 28, 2015.

Trifonov et al. "Polar codes with dynamicfrozen symbols and their decoding by directed search", 2013 IEEE Information Theory Workshop (ITW), IEEE, Sep. 13, 2013.

Arikan, "Channel polarization: A method for constructing capacity-achieving codes for symmetric binary-input memoryless channels", IEEE Transactions of Information Theory, vol. 55, pp. 1-23, Jul. 2009, 23 pages total.

Tal et al., "List Decoding of Polar Codes", IEEE Transactions on Information Theory, vol. 61, No. 5, pp. 2213-2226, May 2015, 14 pages total.

Wang et al., "Parity-Check-Concatenated Polar Codes", IEEE Communications Letters, vol. 20, No. 12, pp. 2342-2345, Dec. 2016, XP011636292, 4 pages total.

Trifonov, "Star Polar Subcodes", 2017 IEEE Wireless Communications and Networking Conference Workshops (WCNCW), IEEE, Mar. 19, 2017, pp. 1-6, XP033093163, 6 pages total.

Chiu et al., "Reduced-Complexity SCL Decoding of Multi-CRC-Aided Polar Codes", pp. 1-9, Sep. 28, 2016, Retrieved from the Internet: URL:https://arxiv.org/pdf/1609.08813.pdf [retrieved on Jun. 23, 2017], XP055384603, 9 pages total.

Yu et al., "Hybrid Parity-check and CRC Aided SCL Decoding for Polar codes", 2016 IEEE International Conference on Internet of Things (iThings) and IEEE Green Computing and Communications (GreenCom) and IEEE Cyber, Physical and Social Computing (CPSCom) and IEEE Smart Data (SmartData), pp. 711-716, Dec. 15, 2016, XP033093024, 6 pages total.

International Search Report dated Dec. 4, 2017 issued by the International Searching Authority in International Application No. PCT/JP2017/013306.

Written Opinion dated Dec. 4, 2017 issued by the International Searching Authority in International Application No. PCT/JP2017/013306.

* cited by examiner

DETERMINATION OF SET OF INFORMATION BIT INDICES FOR CHECK BITS

COMMUNICATION METHOD AND APPARATUS USING POLAR CODES

This application is a National Stage Entry of PCT/JP2017/013306 filed on Mar. 30, 2017, the contents of all of which are incorporated herein by reference, in their entirety.

TECHNICAL FIELD

The present invention relates to a communication apparatus using polar codes, and particularly to check-bit (e.g., parity-check (PC) or cyclic-redundancy check (CRC)) concatenated polar codes.

BACKGROUND

Polar codes introduced in NPL 1 are the first family of provably capacity-achieving codes in Binary-Input Discrete Memoryless Symmetric (BI-DMS) class of channels. Polarization is a linear transform that converts N copies of a BI-DMS channel into one of the two extremes, i.e., bit-channels with very low error probabilities (very high capacities) or bit-channels with very high error probabilities (very low capacities), where N is length of polar codeword. It has been shown that for very large N (asymptotic case), the fraction of bit-channels with low error probabilities approaches the capacity of the underlying BI-DMS channel. Encoding of (N, K) polar codes involve:

- putting information bits at the K indices out of N indices with relatively low error probabilities (also called Non-Frozen (NF) set) and putting a constant bit pattern (such as all-zero pattern) at the remaining N-K indices with higher error probabilities; and then
- multiplying the resulting vector with the generator matrix which may be n-times Kronecker product of a 2×2 matrix $G_2$ $$G_2 = \begin{pmatrix} 1 & 0 \\ 1 & 1 \end{pmatrix},\qquad \text{(Math. 1)}$$

referred to as the polarizing kernel. The resulting codeword is then transmitted.

The decoder at the receiver side takes the log-likelihood ratios (LLRs) of the received values as input and performs decoding to output the estimated information vector. Successive Cancellation (SC) decoder introduced in NPL 1 is the most fundamental decoder for polar codes. SC List decoder (SCL) and CRC-aided SCL (CA-SCL) decoders have been introduced subsequently to boost up the decoding performance. Another variant of the polar code called Parity-Check concatenated polar codes with SCL decoder (PC-SCL) decoder has been disclosed in NPL 3. The selection of positions of PC or CRC bits before encoding of polar codes is an important problem as it may have impact on the performance of the resulting code.

NPL 2 introduces a SCL decoding algorithm for CRC-aided polar codes. In SCL decoding algorithm, every information bit is decoded into two paths, both 0 and 1. Thus the decoding paths double every time an information bit is decoded. To restrict the growing number of decoding paths, a predetermined number of best paths are selected out of all the generated paths and the remaining paths are eliminated. CRC bit are used as concatenation with polar codes to detect the correct path based on CRC test.

NPL 3 introduces two methods for construction of PC-concatenated polar codes with SCL decoder. In the first method called pure random construction, the parity check bits are appended at the end of the codeword or scattered uniformly at random within the codeword. In the second method called heuristic construction, the non-frozen indices are divided into groups of burst error segments. The grouping of non-frozen indices based on burst error segments is done by drawing a boundary between two consecutive indices with most significant gap in error probability. The parity check indices are uniformly scattered across these segments.

CITATION LIST

Non Patent Literature

[NPL 1]
E. Arikan, "Channel polarization: A method for constructing capacity-achieving codes for symmetric binary-input memoryless channels", IEEE Transactions of Information Theory, vol. 55, pp. 3051-3073, July 2009.

[NPL 2]
I. Tal and A. Vardy, "List decoding of polar codes", IEEE Transactions of Information Theory, vol. 61, no. 5, pp. 2213-2226, May 2015.

[NPL 3]
T. Wang, D. Qu and T. Jiang, "Parity-check-concatenated polar codes", IEEE Communication Letters, Vol. 20, Issue 12, December 2016.

SUMMARY

Technical Problem

When decoding an information bit according to SCL decoding algorithm, instead of making a hard decision for each information bit as done in SC decoding algorithm, the decoding path is split into two halves assuming that the information bit can be both 0 and 1. If the number of paths exceed a predetermined number called list size (L), then the L best paths are selected and remaining paths are deleted. This operation of selecting the L best decoding paths out of the 2L paths in SCL decoding algorithm may be called "list pruning" or "path pruning." Each decoding path is scored by a metric called "path metric" which reflects if the bit decision is in accordance with LLR or not. Conventional SCL decoder selects the L decoding paths that have the best path metrics.

Problem in conventional SCL decoder is that if the correct decoding path does not have very good path metric value, it may not feature in the list of L most probable paths and may get eliminated in the list pruning process. In such a case, even a Maximum Likelihood (ML) decoder would make decoding error as the correct decoding path does not even exist in the list. Even if the correct decoding path survives in the list till the last bit is decoded, it may not be selected as decoder output at the last step if it does not have the best path metric value among all the surviving decoding paths. CRC bits or parity bits can be used to solve such a problem.

CRC or PC bits can be used to detect the correct decoding path from the list. For example, a path that qualifies the CRC or PC test may be considered as a correct decoding path. Appropriate selection of the indices for CRC bits or PC bits before performing polar encoding is an important problem because it can affect the error correcting performance of the resulting code.

In conventional CRC-aided polar code, the CRC bits are placed at the end of the non-frozen set. Thus CRC test is performed after decoding all the information bits. Thus CRC test is used to select the correct path at the last stage, however a correct decoding path may still get pruned much earlier.

An objective of the present invention is to provide a technique for choosing good index positions for CRC or PC bits in polar codes which can help the resulting code to achieve good error correcting performance.

Solution to Problem

According to an aspect of the present invention, a communication apparatus includes: an encoder that encodes an input vector to output a codeword using a generator matrix of polar code; a memory that stores a frozen set including frozen bit indices and a non-frozen set including non-frozen bit indices; and a controller that is configured to: a) select at least one check bit index from the frozen set in descending order of row weights of the generator matrix and in descending order of index reliabilities of the input vector; b) select at least one non-frozen bit index from the non-frozen set to compute at least one check bit from at least one bit of information bits at the at least one non-frozen bit index; and c) put the at least one check bit at the at least one check bit index.

According to another aspect of the present invention, a method for controlling an encoder that encodes an input vector to output a codeword using a generator matrix of polar code in a communication device, includes: a) storing a frozen set including frozen bit indices and a non-frozen set including non-frozen bit indices in a memory; b) selecting at least one check bit index from the frozen set in descending order of row weights of the generator matrix and in descending order of index reliabilities of the input vector; c) selecting at least one non-frozen bit index from the non-frozen set to compute at least one check bit from at least one bit of information bits at the at least one non-frozen bit index; and d) putting the at least one check bit at the at least one check bit index.

According to a further aspect of the present invention, a communication apparatus includes: a decoder that decodes a received codeword by using a decoding algorithm based on a successive cancellation method such as a Successive Cancellation decoding algorithm or a Successive Cancellation List decoding algorithm; and a controller that is configured to check if a decoding path is correct, by using a check function employed at another communication apparatus.

According to a still further aspect of the present invention, a communication system includes: a sender device that encodes an input vector to a codeword using a generator matrix of polar code; and a receiver device that receives the codeword from the sender device through a transmission channel, wherein the sender device comprises: a memory that stores a frozen set including frozen bit indices and a non-frozen set including non-frozen bit indices; and a controller that is configured to: a) select at least one check bit index from the frozen set in descending order of row weights of the generator matrix and in descending order of index reliabilities of the input vector; b) select at least one non-frozen bit index from the non-frozen set to compute at least one check bit from at least one bit of information bits at the at least one non-frozen bit index; and c) put the at least one check bit at the at least one check bit index.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims. In addition to the objects mentioned, other obvious and apparent advantages of the invention will be reflected from the detailed specification and drawings.

DETAILED DESCRIPTION

Hereinafter, the word "exemplary" is used herein to mean "serving as an example, instance, or illustration". Any embodiment described herein as "exemplary" is not necessarily to be construed as preferred or advantageous over other embodiments.

1. Outline of Exemplary Embodiments

The conventional technical problems as discussed above can be solved by one or more variants of the exemplary embodiments of the present invention. In this present disclosure, a method for good selection of check bits is introduced in order to construct check-bit concatenated polar codes. Throughout this disclosure, a check bit can be construed as at least one of a parity check (PC) bit or cyclic redundancy check (CRC) bit.

Figure 1:
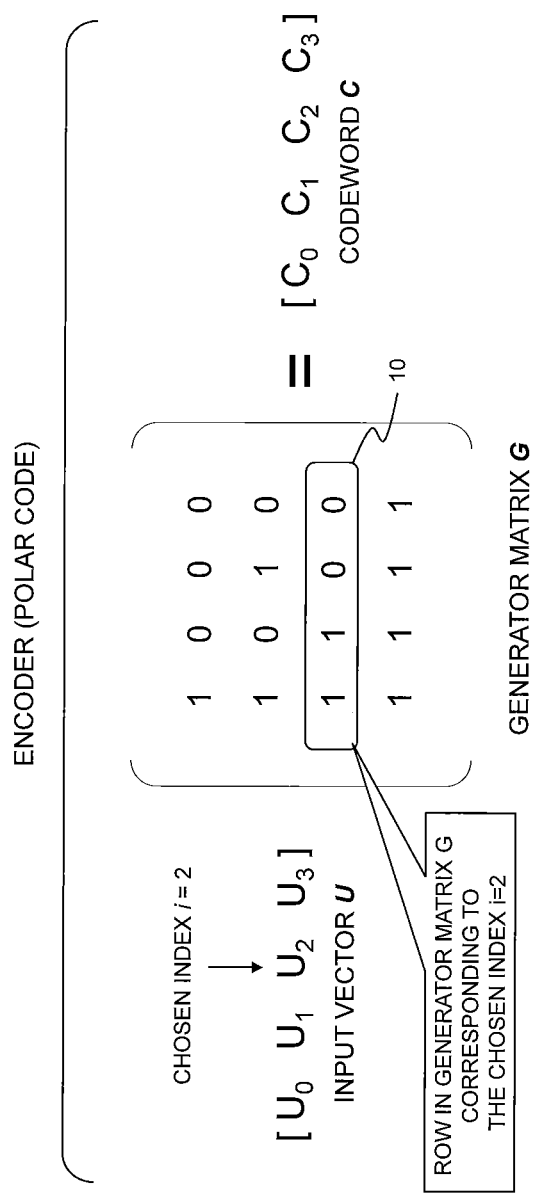
FIG. 1 is a schematic diagram illustrating an encoding operation using an example of the generator matrix of polar codes for generally explaining an encoding operation.

To begin with, an encoder for polar codes performs an encoding operation as illustrated in FIG. 1. Assuming an encoding mechanism of code length N=4, an un-encoded input vector U where each of the 4 bits are $U_0$, $U_1$, $U_2$ and $U_3$, a 4×4 generator matrix G and an encoded codeword C where the code bits are $C_0$, $C_1$, $C_2$ and $C_3$ are shown. For instance, when an index i=2 is chosen in the input vector U, a row 10 of the generator matrix G corresponds to the chosen index i=2. Since the row 10 includes two 1s, row weight or Hamming weight of this row is 2.

Figure 2:
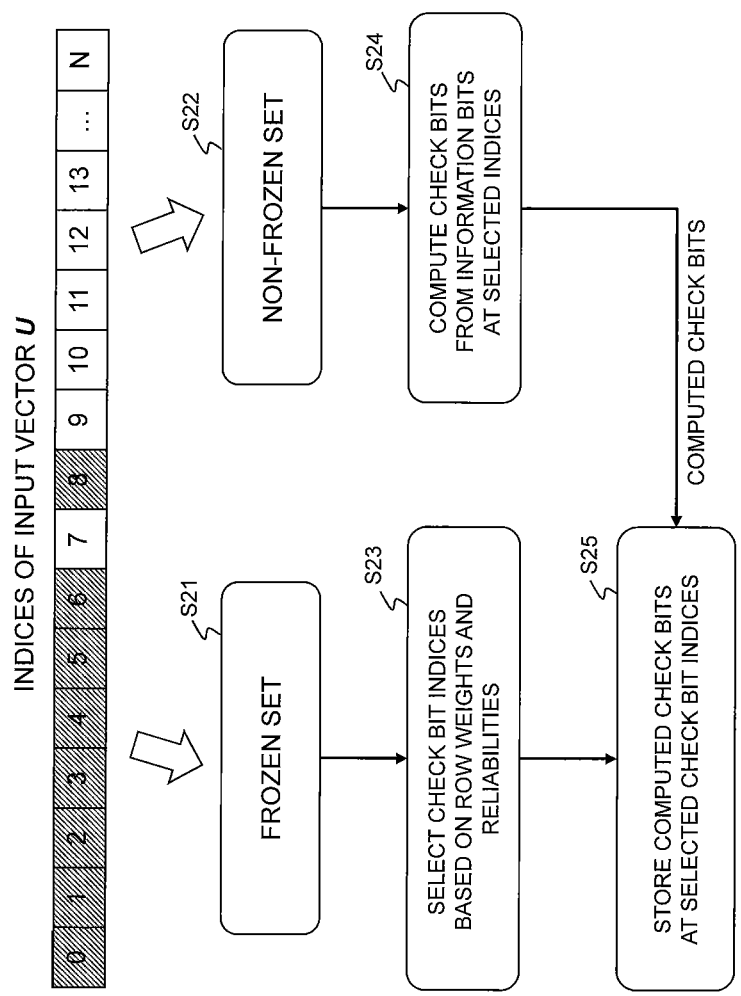
FIG. 2 is a schematic flowchart illustrating a check-bit constructing operation according to an exemplary embodiment of the present invention.

An outline of constructing check bits will be described with reference to FIG. 2. N indices of input vector U are divided into a frozen set and a non-frozen set based on reliabilities of indices (Operations S21 and S22), A predetermined number of check bit indices are selected as a check bit set from the frozen set in descending order of row weights (Hamming weights) and reliabilities (Operation S23). In the case where a plurality of indices with the same highest row weight are selected, one index having the highest reliability is selected. On the other hand, one or more non-frozen indices is selected from the non-frozen set to compute a predetermined number of check bits (Operation S24). The computed check bits are stored at the check bit indices in the check bit set (Operation S25). More detailed methods according to the exemplary embodiments will be described in the paragraphs that follow.

1.1) Construction of Check-Bit Concatenated Polar Codes

According to the disclosed method, an (N, K) polar code concatenated with P check-bits may be constructed through the following steps.

Step 1) the N indices may be arranged in ascending/descending order of reliability. For instance, the N indices are arranged in ascending order of decoding error probability or Z parameter. In this case, the first K indices from this reliability-ordered set may be included in a set called non-frozen set. The remaining N-K indices may be included in a set called frozen set. Note that Bhattacharyya parameter is used as a metric for decoding error probability.

Step 2) The check-bit indices may be selected from the frozen set according to the following rule. At first, the indices in the frozen set may be arranged in ascending/descending order of row weights of the indices. A row weight of a chosen index means the weight of the row in the generator matrix of polar codes corresponding to the chosen index. If only one index has the highest row weight in the frozen set, then this index is included in the set of check bit indices. If more than one index in the frozen set have the highest row weight, then the index among them that has the highest reliability (e.g., lowest decoding error probability or Z parameter) is included in the set of check bit indices.

Step 3) These two steps 1 and 2 (first selecting the indices with the highest row weight in frozen set and then selecting one index out of them with highest reliability) are repeated for P times to obtain the set of check bit indices consisting of P indices.

Step 4) Then information bits are put in the K indices of non-frozen set. The check bits may be computed using one or more indices from the non-frozen set and may be put in the indices contained in the set of check bit indices selected from the frozen set. The remaining indices of the frozen set may be filled with zero bits. The resulting vector may be then multiplied with the generator matrix of polar codes to produce the final codeword. This codeword may be transmitted over a communication channel.

1.2) Selection of Indices from Non-Frozen Set for Check-Bit Computation

One or more indices from the non-frozen set may be used to construct the check bits. There can be a plurality of methods of constructing the check bits, including, but not limited to, the following methods.

(1) In one method, a check bit may be determined by copying one bit from the non-frozen set. Index of the bit from the non-frozen set may be determined according to the following rule. At first, the indices in the non-frozen set may be arranged in ascending/descending order of their row weights. If only one index has the lowest row weight in the non-frozen set, then the bit at this index may be copied to the check bit index. If more than one index in the non-frozen set have the lowest row weight, then the index among them that has the lowest reliability (e.g., highest decoding error probability or Z parameter) may be copied to the check bit index. These two steps (first selecting the indices with lowest row weight in non-frozen set and then selecting one index out of them with lowest reliability) may be repeated for P times to obtain P information bits that may be copied to the check bit indices.

(2) In another method, a check bit may be computed using some check function of at least one or more of the non-frozen bits selected using the aforementioned rule. For example, the check function may be a PC function or CRC function.

(3) In another variant, the check-bits may be computed using check function over part or whole of the non-frozen set indices. For example, the non-frozen set indices may be divided into several groups. A check function over each group may be used to generate the check-bits.

Further specific details of the many variants discussed above will be explained using the following embodiments supplemented by figures.

1.3) Decoding of Codeword

At the decoder of a receiver, for decoding the codeword produced by a sender using the above-described method, the LLRs of the channel output are used as input. The frozen indices in the decoded output are set to 0 in advance. The remaining bits including the information bits and the check bits are decoded successively using the method such as SC or SCL decoding algorithm. In case of SCL decoding, list-pruning can be assisted by using the check-bits.

As an example, assuming that a predetermined bit in the non-frozen set selected (see FIG. 6) is copied as check bit to the check bit index selected from the frozen set (see FIG. 5), check bit comparison for list pruning can be performed immediately after both the check bit and the predetermined bit in the non-frozen set has been decoded. If SCL decoder is used, then after decoding both the predetermined bit in the non-frozen set and the check bit, it can be checked if their decoded values are same. All the decoding paths that do not satisfy this equality may be pruned immediately instead of waiting till the last stage of SCL decoding when all bits in a frame are decoded.

As another example, it is assumed that x, y and z are three indices involved in a check-bit equation as x=y+z where y and z may be information bits and x may be the computed check bit. Here the check function used is binary addition. It is assumed that x appears first in the SC decoding order followed by y, and y is followed by z. Then after performing SCL decoding till the bit z it is possible to check whether the binary addition of y and z equals x, without waiting till all bits of the frame are decoded. Accordingly, a check test can be performed to confirm which path among all the decoding paths satisfy the relation: x=y+z. A decoding path that fails to satisfy the relation may be pruned immediately. Thus, list pruning can be aided by the check-bit test much early, instead of waiting till the end when all bits are decoded.

1.4) Advantages

As described above, by choosing the indices from the non-frozen set that have lowest row-weight and using them up for check-bit computation (e.g., copying them to the indices in the frozen set with high row weights), it may be possible to improve the error correcting performance of the resulting concatenated code. The number of codewords with minimum Hamming weight affects the error correcting performance of a code. The lesser the number of codewords with minimum Hamming weight, the better is the error correcting performance of a code. In the exemplary embodiments of this invention, one or more non-frozen index with lowest Hamming weight of a corresponding row in the generator matrix is chosen and then is coupled with a check-bit index with high row weight chosen from the frozen set. Thus, the number of non-frozen indices with lowest Hamming weight of the corresponding row in the generator matrix may be reduced. This may result in improved error correcting performance.

Furthermore, the check-bits may be used to aid the SCL decoder by detecting the correct decoding path. Thus, the check-bits may be used to prune the list of SCL decoder early so as to prevent the correct decoding path from getting pruned. Also, the check-bits may be used to determine the decoder output at the last step of decoding by choosing the path that qualifies the check test.

2. Exemplary Embodiment

Hereinafter, an exemplary embodiment of the present invention will be discussed in its complete details with accompanying figures and finally explained with an exemplary scenario. The embodiment described herein is only illustrative of some specific representations of the invention acknowledging the fact that the inventive concepts can be embodied in a wide variety of contexts. Thus the exemplary embodiment does not limit the scope of the present invention.

2.1) System Configuration

A communication device according to the exemplary embodiment of the present invention will be described as a sender device or a receiver device. The sender device and the receiver device may be integrated into a single communication device.

Figure 3:
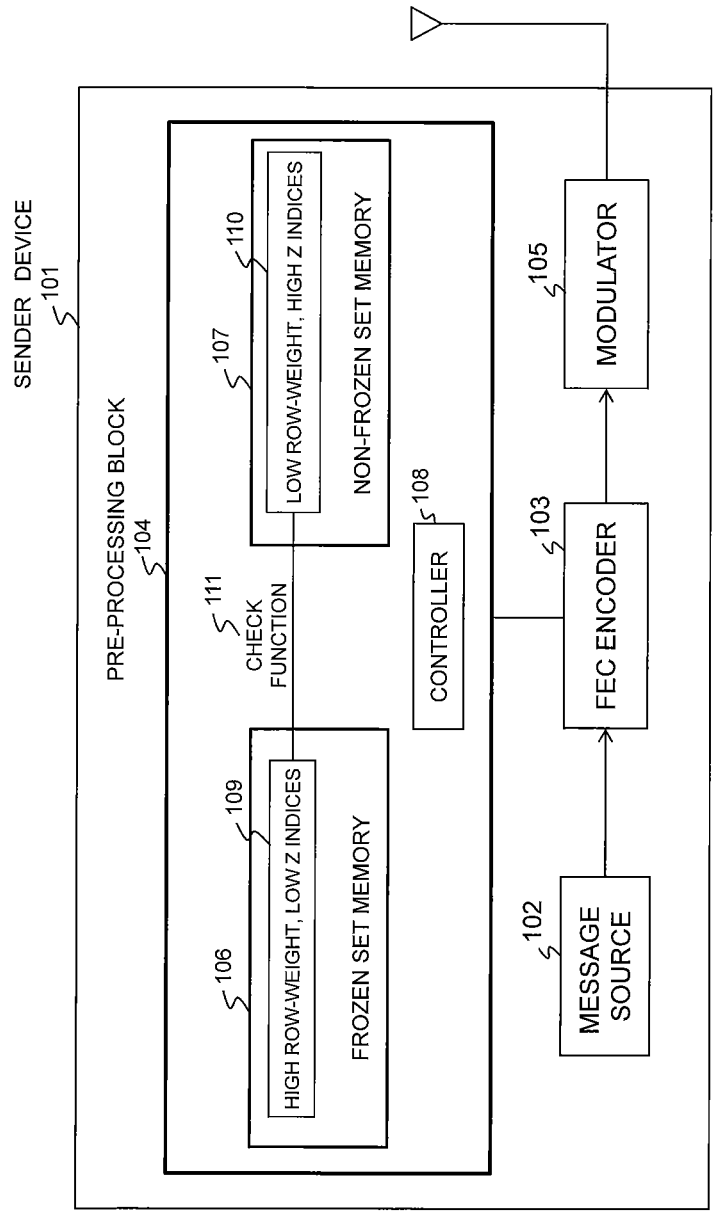
FIG. 3 is a schematic diagram illustrating a functional configuration of a sender device according to an exemplary embodiment of the present invention.

As illustrated in FIG. 3, a sender device 101 is provided with data sending functions including a message source 102, a Forward Error Correction (FEC) encoder 103 of encoding scheme for Polar Codes, a pre-processing block 104, and a modulator 105, which may be implemented on a processor running respective programs stored in a memory device (not shown). In the present embodiment, the pre-processing block 104 includes a frozen set memory 106, a non-frozen set memory 107 and a controller 108. Taking as an example the case where parity check-bit is used as check-bit, the frozen set memory 106 stores a set of N-K indices with lowest reliabilities (highest Z parameters). The non-frozen set memory 107 stores a set of K indices with highest reliabilities (lowest Z parameters). The controller 108 selects a subset of frozen indices with high row weight and low Z parameter (shown by reference numeral 109) from the frozen set memory 106, and also selects a subset of non-frozen indices with low row weight and high Z parameter (shown by reference numeral 110) from the non-frozen set memory 107. The controller 108 may compute check-bits using indices within the subset of indices 110. The controller 108 performs the following operations: selection of check-bit indices; selection of indices from which the check-bits are computed; and determination of check-bits using a check function 111. As described later, the check function 111 may be one of computational operations such as copying and computation of check bits.

The message source 102 generates some information bits that need to be encoded and then transmitted. The pre-processing block 104 employs a rule for selection of check-bit indices. Once the check-bit indices are selected, then it computes the check-bits employing a suitable check function. Finally, an input vector constructed by placing information bits (received from message source 102) at the non-frozen indices, check-bits at the check-bit indices and 0 at the frozen set is fed as input to the FEC encoder 103. The FEC encoder 103 encodes the input vector into a polar codeword. The modulator 105 modulates the codeword and then sends it to a radio-frequency (RF) unit for transmission (not shown).

It should be noted that FIG. 3 shows only an example where parity check-bit is used as check-bit. For using CRC bits as check-bits, the set of frozen indices 109 remains unchanged, but the set of non-frozen indices 110 may be different, which will be described later with reference to FIG. 8 and FIG. 9.

Figure 4:
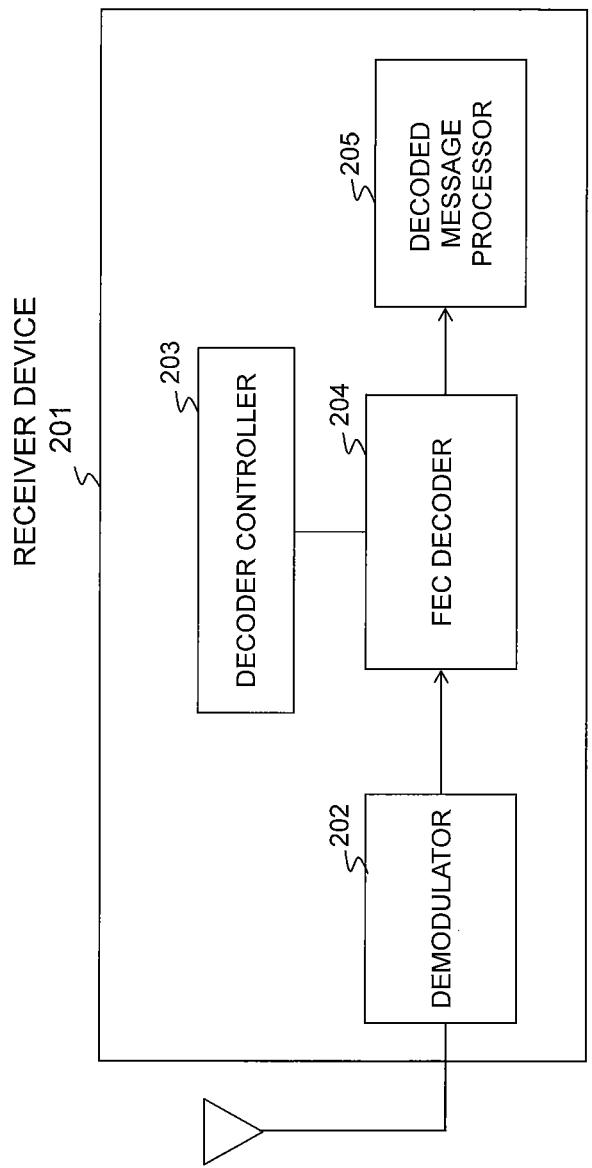
FIG. 4 is a schematic diagram illustrating a functional configuration of a receiver device according to the exemplary embodiment.

As illustrated in FIG. 4, a receiver device 201 is provided with data receiving functions including a demodulator 202, a decoder controller 203 for performing a check if a decoding path is correct using a check function employed at the sender device 101, a FEC decoder 204 and a decoded message processor 205, which may be implemented on a processor running respective programs stored in a memory device (not shown). LLRs of the received vector are fed as input to the FEC decoder 204. The FEC decoder 204 runs a decoding algorithm on the LLR vector to produce a decoded message, which is output to the decoded message processor 205 while the decoder controller 203 performing the check-bit computation which will be described later.

2.2) Determination of Set of Check-Bit Indices

Figure 5:
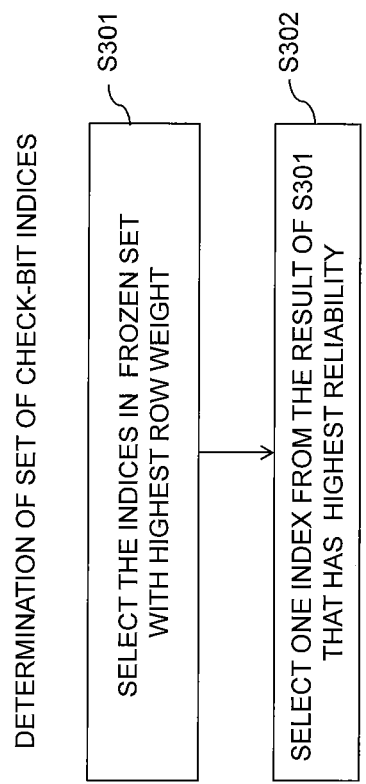
FIG. 5 is a flowchart illustrating an operation of determining the set of indices for check bits in the frozen set at the sender device shown in FIG. 3.

FIG. 5 shows a schematic flowchart explaining the method to determine the set of check-bit indices according to the exemplary embodiment of the present invention. As explained above, a check-bit position can be determined by the two-stage selection method. In the first stage of selection (Operation S301), all indices in the frozen set with the highest row weight are listed up. This is followed by the second stage (Operation S302), where the most reliable index (e.g., index with the lowest value of error probability or Z parameter) is selected from the indices selected by the operation S301. These two stages (S301 and S302) may be repeated for P times to obtain P distinct check-bit indices.

Figure 6:
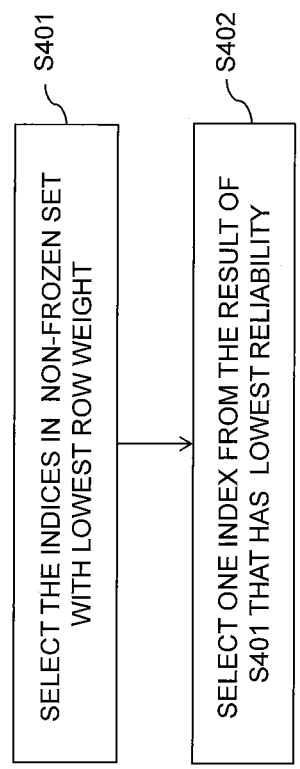
FIG. 6 is a flowchart showing an operation of determining the set of information bit indices to be used to compute the parity check bits at the sender device shown in FIG. 3.

2.3) Determination of Set of Information Bit Indices Used to Generate Check-Bits FIG. 6 shows a schematic diagram explaining a method to determine the set of information bit indices used to generate the check-bits, according to the exemplary embodiment of the present invention. The information bit indices can be selected by the following two-stage process. In the first stage (Operation S401), all indices in the non-frozen set with the lowest row weight are listed up. Then in the second stage (Operation S402), the least reliable index (e.g., index with the highest value of error probability or Z parameter) is selected from the indices selected by the operation S401. These two stages (S401 and S402) may be repeated for P times to obtain P distinct information bit indices. Check-bits may be computed using these selected information bits. However, in some variants, part or whole of the information bits may be used to generate the check-bits.

2.4) Determination of Check-Bits

There can be many variants of the method of determination of check-bits. Some of such variants are explained by references to FIG. 7 to FIG. 9.

First Example

Figure 7:
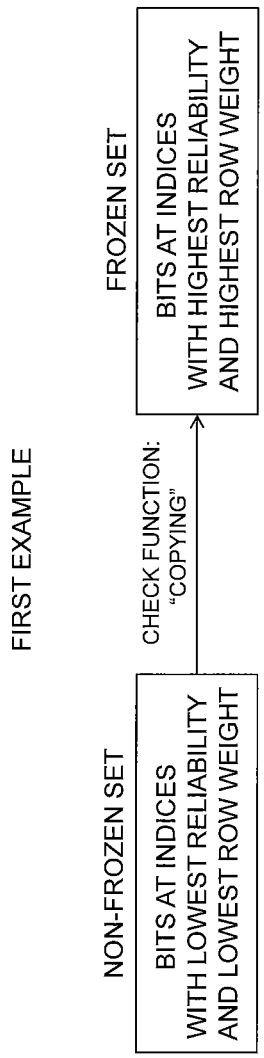
FIG. 7 is a block diagram showing a first example of check function in the sender device shown in FIG. 3.

In the first example as shown in FIG. 7, bits at the indices in the non-frozen set with the lowest row weight and lowest reliability (determined by the operations S401 and S402 in FIG. 6) are copied to the indices in the frozen set with the highest row weight and highest reliability (determined by S301 and S302 in FIG. 5). This copying operation overwrites bits at the selected indices in the frozen set with the selected ones of the information bits in the non-frozen set. The copying operation is an example of the check function. The check function may generate one or more output check bit from the selected bits of the non-frozen set and then puts the output check bits into the selected indices in the frozen set with highest row weight and highest reliability.

Second Example

Figure 8:
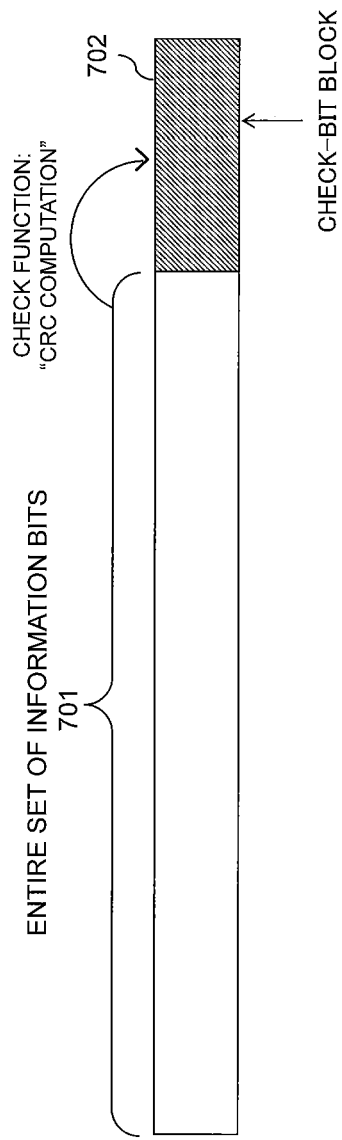
FIG. 8 is a diagram showing a second example of check function in the sender device shown in FIG. 3.

As shown in FIG. 8 the entire set of information bits (indicated by reference numeral 701) may be used as input to a CRC function. In this case, the output CRC bits (CRC-bit block 702) may be put in the indices determined by S301 and S302. Since the CRC bits are computed using all the information bits, hence the CRC test to detect correct decoding path may only be performed after decoding all information bits and CRC bits.

Third Example

Figure 9:
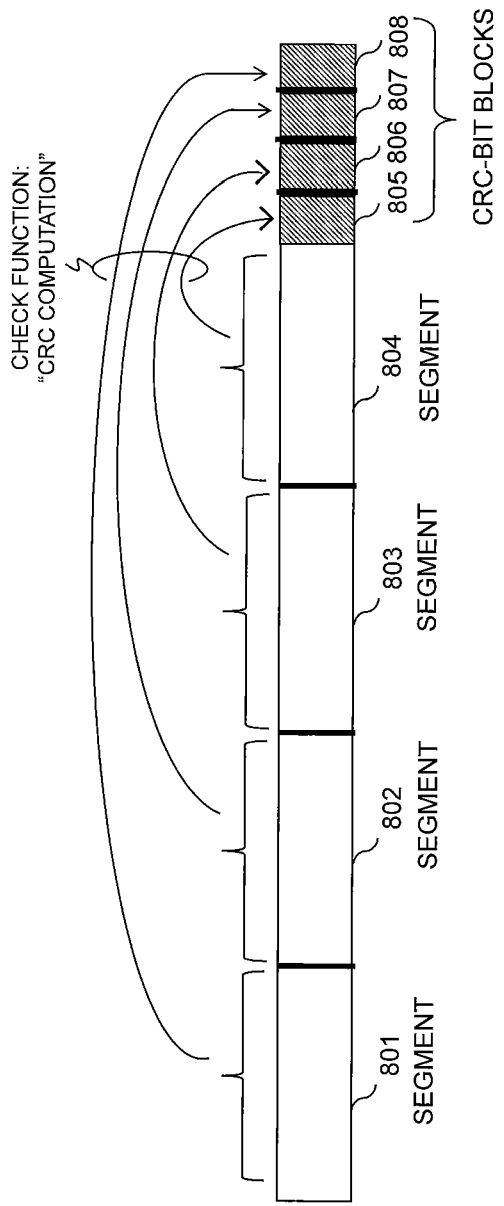
FIG. 9 is a block diagram showing a third example of check function in the sender device shown in FIG. 3.

As shown in FIG. 9, the entire set of information bits may be split into segments (shown by reference numerals 801, 802, 803 and 804). Each such segment of information bits is used by a CRC function to generate some CRC bits. These CRC bits are put in the indices of the frozen set that are determined by S301 and S302. In this example, CRC bits in the block 805 are computed from the segment 804 of information bits, CRC bits in the block 806 are computed from the segment 803 of information bits, CRC bits in the block 807 are computed from the segment 802 of information bits and CRC bits in the block 808 are computed from the segment 801 of information bits. The sequence of the CRC-bit blocks 805-808 may be changed.

2.5) Decoding Path and Path Pruning

Figure 10:
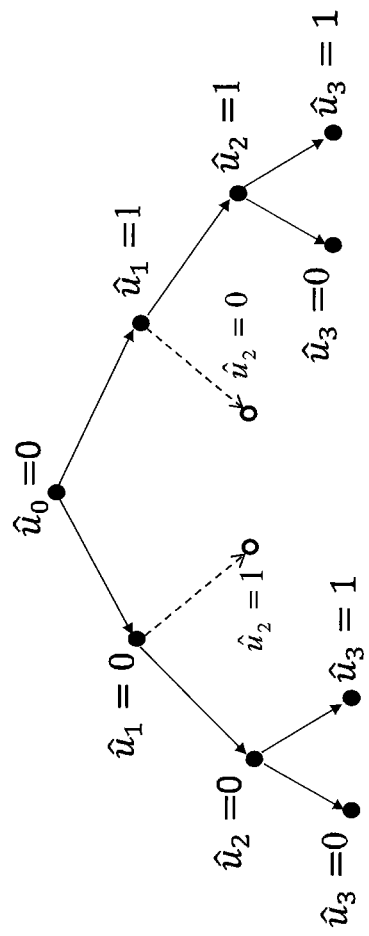
FIG. 10 is a diagram showing an illustrative example of decoding tree of SCL decoding algorithm to explain decoding paths and path-pruning using check-bits, according to the example of the exemplary embodiment.

Referring to FIG. 10, the term 'decoding path' is clarified and a way of pruning the set of decoding paths using check-bit when using SCL decoding with the present invention is explained. Note that the method of computing the frozen set, the non-frozen set, the set of check-bit indices, the method of check-bit computation and the conventional method of path pruning using path metric are not described in FIG. 10.

An uncoded vector $u=[u_0\ u_1\ u_2\ u_3]$ is encoded using an encoder of polar codes and transmitted. It is assumed that a set of all indices is $\{0,1,2,3\}$, a non-frozen set is $\{2,3\}$, a set of check-bit index is $\{1\}$ and a frozen set is $\{0\}$. For computing check-bit, it is assumed that information bit $u_2$ is copied to $u_1$, thus $u_1=u_2$ and $$\hat{u}=[\hat{u}_0 \hat{u}_1 \hat{u}_2 \hat{u}_3],\quad\text{(Math. 2)}$$

where $\hat{u}$ is also denoted by $\hat{u}_0$ which is the decoded estimate of u.

At the time of decoding using SCL decoding, $\hat{u}_0$ is set to 0 in advance as it is frozen bit. $\hat{u}_1$ is decoded to both 0 and 1, thus the decoding operation splits into two paths. These two paths are referred to as "decoding path". Thus, two decoding paths $\hat{u}_0\hat{u}_1=00$ and $\hat{u}_0\hat{u}_1=01$ are created. Similarly, $\hat{u}_2$ is also decoded to both 0 and 1 for each of the two decoding paths $\hat{u}_0\hat{u}_1=00$ and $\hat{u}_0\hat{u}_1=01$. Thus four decoding paths are created $\hat{u}_0\hat{u}_1\hat{u}_2=000$, $\hat{u}_0\hat{u}_1\hat{u}_2=001$, $\hat{u}_0\hat{u}_1\hat{u}_2=010$ and $\hat{u}_0\hat{u}_1\hat{u}_2=011$. Then a check test is performed using the relation $u_1=u_2$, or equivalently $\hat{u}_1=\hat{u}_2$, to verify which of the four decoding paths can be a possible correct decoding path. The check test may be performed immediately after decoding $\hat{u}_2$ because both the bits $\hat{u}_1$ and $\hat{u}_2$ used in the check equation $\hat{u}_1=\hat{u}_2$ are available then. The decoding paths $\hat{u}_0\hat{u}_1\hat{u}_2=001$ and $\hat{u}_0\hat{u}_1\hat{u}_2=010$ do not satisfy the relation $\hat{u}_1=\hat{u}_2$ hence decoding paths $\hat{u}_0\hat{u}_1\hat{u}_2=001$ and $\hat{u}_0\hat{u}_1\hat{u}_2=010$ are deleted or discontinued in the decoding tree as shown by dashed lines in FIG. 10. This operation may be referred to as pruning of list in SCL decoder.

In the next step, $\hat{u}_3$ is decoded to both 0 and 1 for each of the two surviving decoding paths $\hat{u}_0\hat{u}_1\hat{u}_2=001$ and $\hat{u}_0\hat{u}_1\hat{u}_2=011$. This results in four decoding paths $\hat{u}_0\hat{u}_1\hat{u}_2\hat{u}_3=0000$, $\hat{u}_0\hat{u}_1\hat{u}_2\hat{u}_3=0001$, $\hat{u}_0\hat{u}_1\hat{u}_2\hat{u}_3=0110$ and $\hat{u}_0\hat{u}_1\hat{u}_2\hat{u}_3=0111$.

At the final stage, one correct decoding path may be selected out of all the surviving paths using at least one of PC, CRC and maximum likelihood. For example, if CRC-aided polar codes is used, a CRC-check may be performed to select one correct decoding path. That means, a decoding path that satisfies a CRC-test may be considered as the decoder output. Alternatively, the decoder output may be selected at the final stage by choosing the decoding path with highest likelihood. A parity-check may also be performed to select one decoding path as the decoder output at the final stage of SCL decoding.

3. Example

Details of an example of the exemplary embodiment of the present invention will be described in the case of Polar Code.

Figure 11:
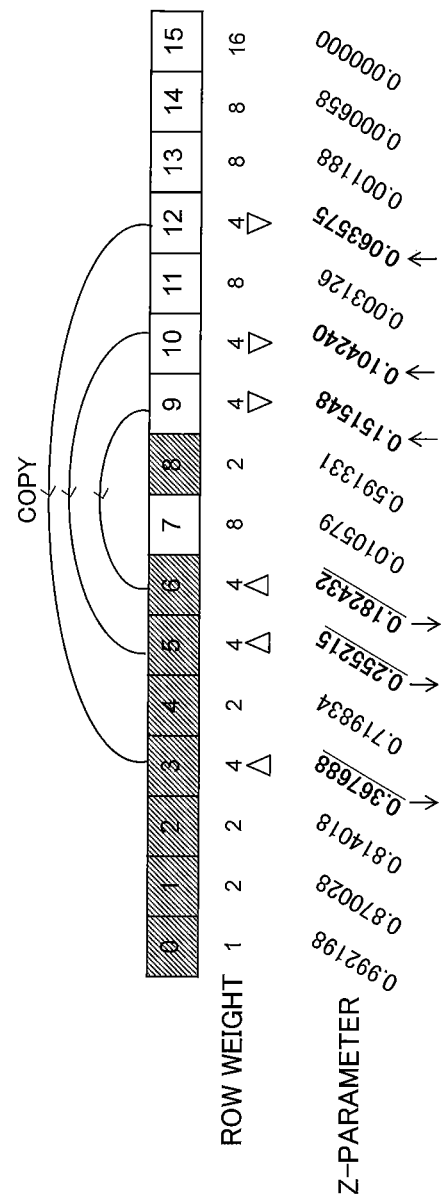
FIG. 11 is a diagram illustrating an example of data stored in the frozen set memory, non-frozen set memory and the operations executed by the processor for constructing check-bit concatenated polar code, according to the example of the exemplary embodiment.

As shown in FIG. 11, a (16,8) polar code with 3 parity check bits may be constructed. More specifically, at first, all 16 indices are divided into two groups (non-frozen set and frozen set) based on their Z-parameter values. The Z-parameters of the indices in this example have been evaluated using Gaussian Approximation of Density Evolution for a Binary Input Additive White Gaussian Noise (BI-AWGN) channel with Eb/No=3 dB and zero mean noise.

It is assumed that the non-frozen set contains the 8 indices with smallest values of Z-parameters, the remaining 8 indices are included in the frozen set. Thus, in this example, the non-frozen set is {7,9,10,11,12,13,14,15} and the frozen set is {0,1,2,3,4,5,6,8}. Then the indices for parity check bits are determined as follows: The indices in the frozen set that have the highest row weight are listed up. Here, the highest row weight in the frozen set is 4. The indices in the frozen set with row weight=4 are {3,5,6}. Among {3,5,6}, the index with the lowest value of Z-parameter is 6. So it is selected as a member of the set of parity-check indices. Then, from the remaining indices {3,5} with the row weight=4, the index with the lowest Z-parameter is 5. So it is included in the set of parity check indices. Since three parity check bits are required in this example, the remaining index 3 is finally included in the set of parity check indices. Thus, the set of parity check indices as {3,5,6} is obtained. If only two parity check indices are required, then the set of parity check indices as {5,6} is obtained.

Next the set of information bits to be used to compute the parity check bits is constructed as follows: The indices in the non-frozen set that have the lowest row weight are listed up. Here, the lowest row weight in the non-frozen set is 4. The indices in the non-frozen set with the row weight=4 are {9,10,12}. Among {9,10,12}, the index with the highest value of Z-parameter is 9. So it is selected as a member of the set of information bit indices to be used for computing parity check bits. Then, among the remaining indices {10, 12} with the row weight=4, the index with the highest Z-parameter is 10. So it is included in the set of information bit indices to be used for computing parity check bits. Finally, the index=12 may also be included in the set of information bit indices to be used for computing parity check bits. Thus, the set of information bit indices to be used for computing parity check bits as {9,10,12} is finally obtained.

Note that, in other variants of the present invention, it is possible not to use all the information bit indices that have the lowest row weight but a subset of that. In this example, "copying" is used for the parity check function. So the information bits at the indices {9,10,12} may be copied to the indices {3,5,6}.

Other variants of parity check functions are equally applicable in this present invention. Thus, the input u to the polar code encoder can be constructed by putting 0 at the indices {0,1,2,4,8}, putting information bits at the indices {7,9,10,11,12,13,14,15}, and copying the information bits from indices {9,10,12} to the indices {3,5,6} as follows:

$$u_i = \begin{cases} 0, & \text{if } i \in \{0, 1, 2, 4, 8\} \\ \text{information bit}, & \text{if } i \in \{7, 9, 10, 11, 12, 13, 14, 15\} \end{cases} \quad \text{(Math. 3)}$$

wherein $u_6=u_9$, $u_5=u_{10}$, and $u_3=u_{12}$.

Finally, the codeword c of a check-bit concatenated polar code may be constructed by multiplying u with the bit-reversal permutation matrix B and the (16×16) generator matrix as follows:

$$c = uBG_2^{\otimes 4}. \quad \text{(Math. 4)}$$

The codeword c is transmitted over a communication channel.

During decoding, the bits at indices {0,1,2,4,8} in the decoder output are set to 0 in advance. All the remaining indices {3,5,6,7,9,10,11,12,13,14,15} are decoded by the usual method of SCL decoding. After decoding index=9, a parity check test may be performed among all the decoding paths to check which of them satisfies the relation $u_6=u_9$. Any path that does not satisfy the relation may be pruned. Again, after decoding index=10, a parity-check test may be performed to check which decoding paths satisfy the relation $u_5=u_{10}$. Any path that does not satisfy the relation may be pruned. Similarly, a parity check test may be performed after decoding index=12 to detect the paths that satisfy the relation $u_3=u_{12}$.

Figure 12:
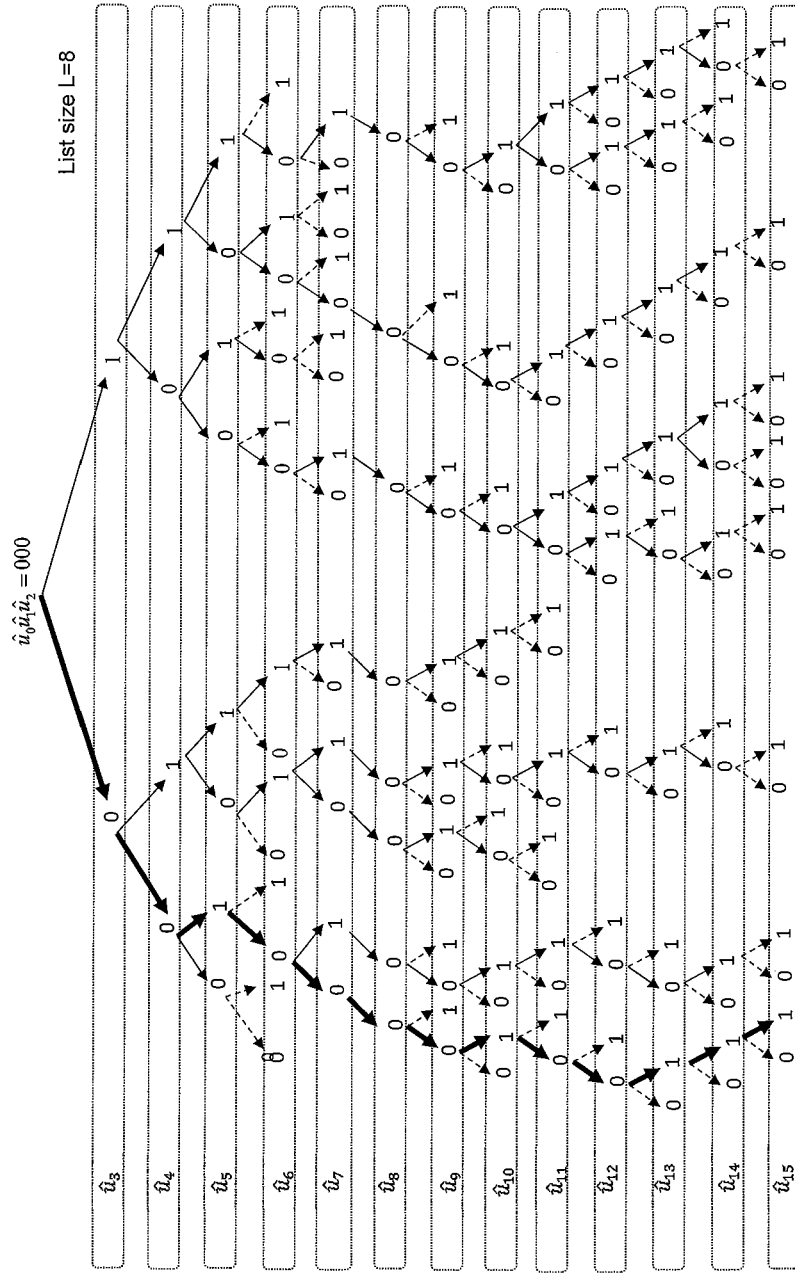
FIG. 12 is a diagram showing an illustrative example of SCL decoding of the exemplary code shown in FIG. 11, according to the example of the exemplary embodiment.

Referring to FIG. 12, an illustrative example of decoding with an SCL decoder of list size 8 is explained. The decoding estimates $\hat{u}_0$, $\hat{u}_1$ and $\hat{u}_2$ are set to 0 as they belong to frozen set. While decoding $\hat{u}_3$, both $\hat{u}_3=0$ and $\hat{u}_3=1$ are assumed, thus creating 2 decoding paths namely, $\hat{u}_0\hat{u}_1\hat{u}_2\hat{u}_3=0000$ and $\hat{u}_0\hat{u}_1\hat{u}_2\hat{u}_3=0001$. By decoding according to the principles of SC decoding along each of the decoding paths, the log-likelihood ratio (LLR) value corresponding to a decoding estimate $\hat{u}_i$ may be represented using the following equation:

$$L_N^{(i)}(y_0^{N-1}, u_0^{i-1}) = \ln \frac{w_N^{(i)}(y_0^{N-1}, u_0^{i-1} | u_i = 0)}{w_N^{(i)}(y_0^{N-1}, u_0^{i-1} | u_i = 1)} = \lambda, \quad \text{(Math. 5)}$$

where $$w_N^{(i)}(y_0^{N-1}, u_0^{i-1} | u_i) \quad \text{(Math. 6)}$$

is the transition probability of the $i^{th}$ subchannel, $y_0^{N-1}$ is the channel output of length N and $u_0^{i-1}$ is the already decoded bit sequence $u_0$ to $u_{i-1}$. A decoder estimate $\hat{u}_i$ corresponding to a bit $u_i$ may be computed from its LLR by using the following relation:

$$\hat{u}_i = \frac{1}{2}(1 - \text{sign}(\lambda)), \text{ where } \text{sign}(\lambda) = \begin{cases} 1, & \lambda \geq 0 \\ -1, & \text{otherwise,} \end{cases} \quad \text{(Math. 7)}$$

A decoding path I may have a path metric $PM_I^i$ after decoding $i^{th}$ bit as $\hat{u}_i$ [I]. $PM_i^I$ can be computed using the following relation:

$$PM_i^I = \begin{cases} PM_i^{i-1}, & \text{if } \hat{u}_i[I] = \frac{1}{2}(1 - \text{sign}(\lambda)) \\ PM_i^{i-1} + |\lambda|, & \text{otherwise.} \end{cases} \quad \text{(Math. 8)}$$

As shown in FIG. 12, each of the decoding paths are again split into two when decoding $\hat{u}_4$ and $\hat{u}_5$. While decoding $\hat{u}_6$, the number of decoding paths becomes 16 which exceeds the list size=8. Hence, it is necessary to select the 8 best decoding paths out of the 16 decoding paths. This may be done by selecting the 8 decoding paths with smallest value of path metric and deleting the remaining 8 decoding paths with highest value of path metric. This process is called path-pruning. For ease of understanding using an example, the paths surviving the path-pruning after decoding $\hat{u}_6$ have been shown using solid arrowed lines. Using the same procedure, path pruning may be done each time the total number of decoding paths exceeds the list size. In a similar manner as $\hat{u}_6$, the decoder may decode $\hat{u}_7$. Since $\hat{u}_8$ is a frozen bit, all the surviving decoding paths are appended by a 0 bit and the path metric is also updated using the rule described above.

Next, the information bit $\hat{u}_9$ is decoded, which is followed by a check test using the check equation: $u_6=u_9$. All the decoding paths that do not satisfy this equation are deleted as shown by dashed arrowed lines and only those decoding paths that satisfy the equation survives. Similarly, another check test may be performed after decoding $\hat{u}_{10}$ to delete any path that do not satisfy the relation: $u_5=u_{10}$. Further, another check test may be performed after decoding $\hat{u}_{12}$ to delete any path that do not satisfy the relation: $u_3=u_{12}$. Thus check bits are used for path-pruning, helping the SCL decoder to select the correct decoding path. For other bits like $\hat{u}_{11}$, $\hat{u}_{13}$ and $\hat{u}_{14}$, the decoder may prune the decoding paths using path metrics as explained before.

At the final stage of decoding, i.e., after decoding the last bit $\hat{u}_{15}$, the decoder may select one decoding path as the decoder output. This selection of one decoding path may be done by choosing the decoding path with smallest value of path metric. In other examples, this may also be done using a check function, like parity check or CRC. For example, the decoding path that may be selected as the final output of the decoder has been shown in thick and bold arrowed line.

The above-described exemplary embodiments and examples of the present invention may be implemented on a processor running programs stored in a memory.

Figure 13:
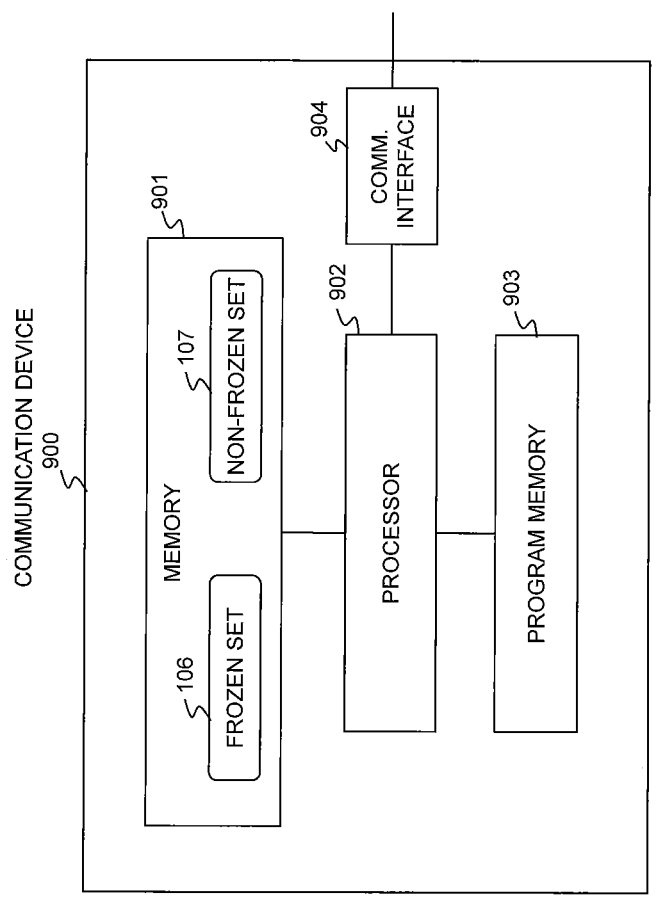
FIG. 13 is a diagram illustrating an architecture of a communication device according to the exemplary embodiment of the present invention.

As illustrated in FIG. 13, a communication device 900 may be provided with at least the sender device 101 as shown in FIG. 3, including the function of selecting check bits to construct check-bit concatenated polar codes as described above. The communication device 900 includes a memory 901, a processor 902, a program memory 903, a communication interface 904, and other units necessary for communication.

The program memory 903 stores computer-readable programs for implementing at least the pre-processing block 104 and the FEC encoder 103 as shown in FIG. 3. According to the programs stored in the program memory 903, the processor 902 uses the frozen set 106 and the non-frozen set 107 in the memory 901 to perform construction of check bits as described above.

Where applicable, various embodiments provided by the present disclosure may be implemented using hardware, software, or combinations of hardware and software. Also where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the spirit of the present invention. In addition, where applicable, it is contemplated that software components may be implemented as hardware components, and vice-versa.

Although embodiments of the present disclosure have been described, these embodiments illustrate but do not limit the disclosure. For example, the frozen set may have any constant bit pattern (not restricting to the all-zero pattern) that is known to the decoder in advance. The generator matrix used in polar code encoding can be even of a form other than the n-time Kronecker product of $$G_2 = \begin{pmatrix} 1 & 0 \\ 1 & 1 \end{pmatrix}. \qquad \text{(Math. 9)}$$

A different matrix may also be used as polarizing kernel. For example, the following matrix can be used as a different polarizing kernel:

$$G_2 = \begin{pmatrix} 1 & 0 & 0 \\ 1 & 1 & 0 \\ 1 & 0 & 1 \end{pmatrix}. \qquad \text{(Math. 10)}$$

Check-bits may be of form other than parity-check or cyclic redundancy check bits. This disclosure does not limit the type of check function used to generate the check-bits. For instance, it can be any kind of parity check function using part or whole of the non-frozen set or frozen set. Reliability of indices may even be evaluated by metrics other than error probability or Z parameter. Bit-reversal permutation matrix B shown in Math. 4 may or may not be used for encoding.

Application software in accordance with the present disclosure, such as computer programs executed by the device and may be stored on one or more computer readable mediums. It is also contemplated that the steps identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

The above exemplary embodiments can be applied to communication systems employing polar encoding and decoding.

REFERENCE SIGNS LIST

101 Sender device
103 FEC Encoder
104 Pre-processing block
105 Modulator
106 Frozen set memory
107 Non-frozen set memory
108 Controller
201 Receiver device
202 Demodulator
203 Decoder controller
204 FEC Decoder
205 Decoded message processor

What is claimed is:

1. A communication apparatus comprising:
an encoder that encodes an input vector to output a codeword using a generator matrix of polar code;

a memory that stores a frozen set including a plurality of frozen bit indices and a non-frozen set including a plurality of non-frozen bit indices, wherein indices of the input vector are divided into the frozen set and the non-frozen set based on index reliabilities of the input vector; and a controller that is configured to:
 a) select at least one frozen bit index among the plurality of frozen bit indices in the frozen set arranged in the descending order of row weights of the generator matrix and in descending order of index reliabilities of the input vector;
 b) select at least one non-frozen bit index among the plurality of non-frozen bit indices in the non-frozen set;
 c) determine at least one check bit from information bits including bits of the at least one frozen bit index and the at least one non-frozen bit index; and
 d) input the at least one check bit as the input vector to the encoder.

2. The communication apparatus according to claim 1, wherein the controller is configured further select a set of check bit indices in a) by
 a.1) selecting the at least one frozen bit index with a highest row weight from the frozen set;
 a.2) responsive to selecting the at least one frozen bit index with the highest row weight within the frozen set in the a.1), selecting one frozen bit index among the at least one frozen bit index that has a lowest decoding error probability; and
 a.3) repeating the a.1) and the a.2) for a predetermined number of times to obtain the set of check bit indices included in a check bit set.

3. The communication apparatus according to claim 2, wherein the controller is configured to select the one frozen bit index among the at least one index in the a.2) by:
 comparing decoding error probabilities of the at least one frozen bit index; and
 selecting one index among the at least one frozen bit index having the lowest decoding error probability.

4. The communication apparatus according to claim 2, wherein Bhattacharyya parameter is used as a metric for determining the decoding error probability for the index reliabilities of the input vector.

5. The communication apparatus according to claim 1, wherein the controller is configured to determine the at least one check bit in the c) by:
 c.1) selecting at least one non-frozen bit index with a lowest row weight from the non-frozen set;
 c.2) responsive to selecting the at least one non-frozen bit index with the lowest row weight from the non-frozen set in the c.1), selecting one non-frozen bit index with a highest decoding error probability among the at least one non-frozen bit index selected in the c.1);
 c.3) repeating the c.1) and the c.2) to obtain the plurality of non-frozen bit indices, wherein the at least one check bit is computed from the bit of information.

6. The communication apparatus according to claim 1, wherein the at least one check bit is determined using at least one check function.

7. The communication apparatus according to claim 6, wherein the check function is one of a cyclic redundancy check and parity check function.

8. The communication apparatus according to claim 1, wherein the controller is configured to determined the at least one check bit in the b) by selecting part or whole of the non-frozen set.

9. A method for generating an input vector for an encoder that outputs a codeword using a generator matrix of polar code, the method comprising:
 a) storing, in a memory, a frozen set including a plurality of frozen bit indices and a non-frozen set including a plurality of non-frozen bit indices, wherein indices of the input vector are divided into the frozen set and the non-frozen set based on index reliabilities of the input vector;
 b) selecting, by a controller, at least one frozen bit index among the plurality of frozen bit indices in the frozen set arranged in descending order of row weights of the generator matrix and in descending order of index reliabilities of the input vector;
 c) selecting, by the controller, at least one non-frozen bit index among the plurality of non-frozen bit indices in the non-frozen set;
 d) determining at least one check bit from information bits including bits of the at least one frozen bit index and the at least one non-frozen bit index; and
 e) inputting, by the controller, the at least one check bit as the input vector to the encoder.

10. The method according to claim 9, wherein the b) comprises:
 b.1) selecting the at least one frozen bit index with a highest row weight from the frozen set;
 b.2) responsive to selecting the at least one frozen bit index with the highest row weight, selecting one frozen bit index among the at least one frozen bit index that has a lowest decoding error probability; and
 b.3) repeating the b.1) and the b.2) for a predetermined number of times to obtain a set of check bit indices included in a check bit set.

11. The method according to claim 10, wherein the b.2) comprises:
 comparing the decoding error probabilities of the at least one frozen bit index; and
 selecting one index among the at least one frozen bit index having the lowest decoding error probability.

12. The method according to claim 9, wherein the d) comprises:
 d.1) selecting at least one non-frozen bit index with a lowest row weight from the non-frozen set;
 d.2) responsive to selecting the at least one non-frozen bit index with the lowest row weight from the non-frozen set in the d.1), selecting one non-frozen bit index with a highest decoding error probability among the at least one non-frozen bit index selected in d.1)
 d.3) repeating the d.1) and d.2) to obtain the plurality of non-frozen bit indices, wherein the at least one check bit is computed using at least one check function from the bit of the information.

13. A non-transitory computer-readable recording medium storing a computer-readable program for generating an input vector for an encoder that outputs a codeword using a generator matrix of polar code, when executed by a processor, causes the processor to:
 store a frozen set including a plurality of frozen bit indices and a non-frozen set including a plurality of non-frozen bit indices, wherein indices of the input vector are divided into the frozen set and the non-frozen set based on index reliabilities of the input vector;
 select at least one frozen check bit index among the plurality of frozen bit indices in from the frozen set arranged in descending order of row weights of the generator matrix and in descending order of index reliabilities of the input vector;

select at least one non-frozen bit index among the plurality of non-frozen bit indices in the non-frozen set;

determine at least one check bit from information bits including bits of the at least one frozen bit index and the at least one non-frozen bit index; and input the at least one check bit as the input vector to the encoder.

\* \* \* \* \*